United States Patent [19]

Shively

[11] 4,169,289

[45] Sep. 25, 1979

[54] DATA PROCESSOR WITH IMPROVED CYCLIC DATA BUFFER APPARATUS

[75] Inventor: Richard R. Shively, Convent Station, N.J.

[73] Assignee: Bell Telephone Laboratories, Incorporated, Murray Hill, N.J.

[21] Appl. No.: 814,041

[22] Filed: Jul. 8, 1977

[51] Int. Cl.² .................. G11C 19/28; G11C 21/00
[52] U.S. Cl. .................................................. 364/900
[58] Field of Search ... 364/200 MS File, 900 MS File

[56] References Cited

U.S. PATENT DOCUMENTS

| | | | |
|---|---|---|---|
| 3,391,391 | 7/1968 | Simpson, Jr. | 364/900 |
| 3,411,138 | 11/1968 | Andreae et al. | 364/900 |
| 3,469,239 | 9/1969 | Richmond et al. | 364/200 |
| 3,564,505 | 2/1971 | Finnila et al. | 364/200 |
| 3,573,855 | 4/1971 | Cragon | 364/200 |
| 3,686,641 | 8/1972 | Logan et al. | 364/200 |
| 3,742,458 | 6/1973 | Inoue et al. | 364/200 |
| 3,878,513 | 4/1975 | Werner | 364/200 |
| 4,078,258 | 3/1978 | Lindsey et al. | 364/900 |
| 4,084,258 | 4/1978 | Bluethman | 364/900 |

FOREIGN PATENT DOCUMENTS 450174  12/1972  U.S.S.R. .................................. 364/200

Primary Examiner—Gareth D. Shaw
Assistant Examiner—C. T. Bartz
Attorney, Agent, or Firm—Stephen J. Phillips; Robert O. Nimtz

[57] ABSTRACT

Apparatus for designating contiguous memory locations in a data memory as a circular data buffer. A limit register defines the topmost buffer location and a modulus register defines the length of the buffer. Circuitry detects violations of the upper boundary of the buffer and subtracts the buffer length from the address. Boundary violation circuitry also controls conditional execution of a data processor instruction which conditionally subtracts the buffer length from the address.

6 Claims, 1 Drawing Figure

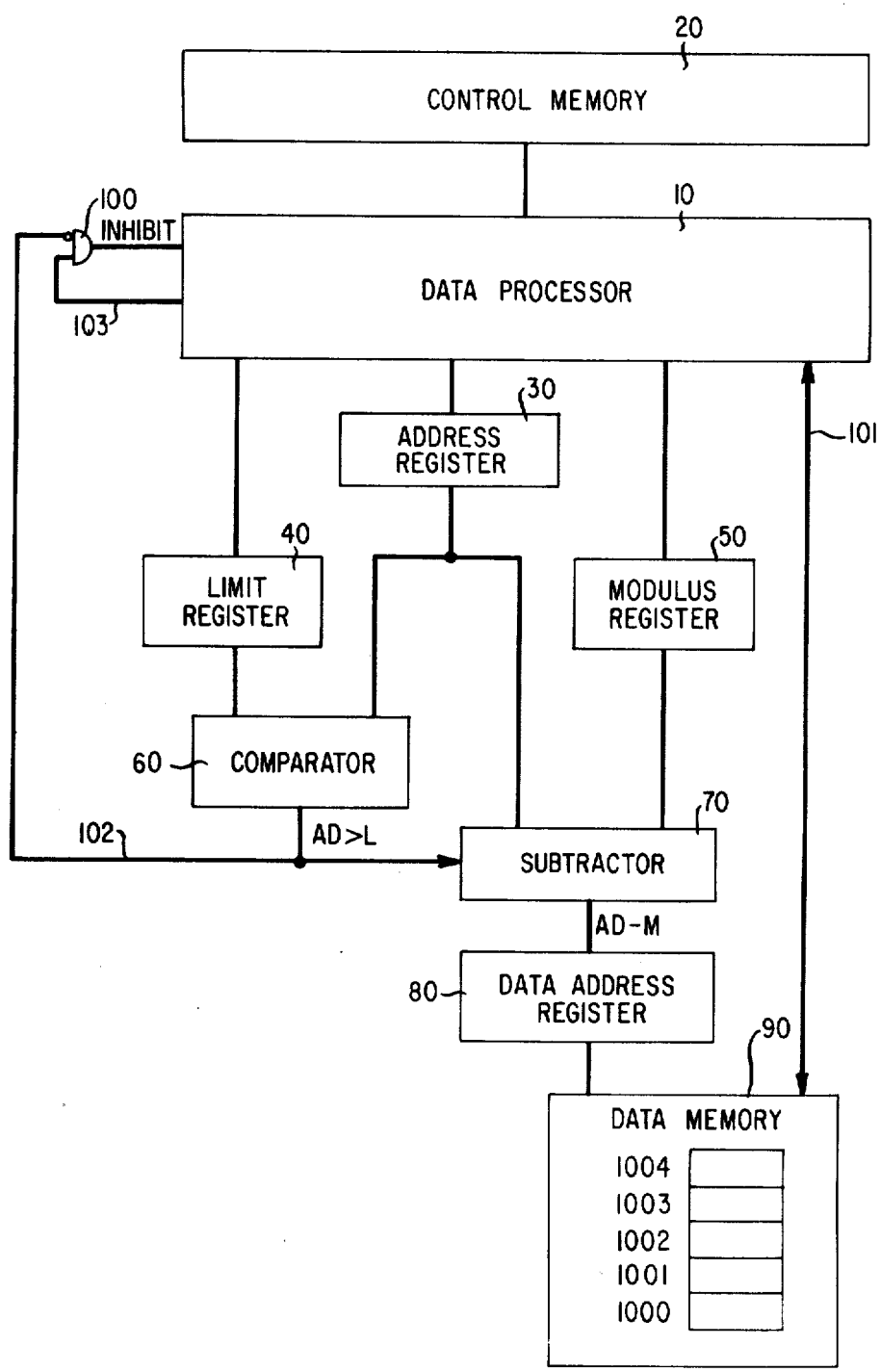

4,169,289

DATA PROCESSOR WITH IMPROVED CYCLIC DATA BUFFER APPARATUS

BACKGROUND OF THE INVENTION

1. Field of the Invention

This invention relates to data processors, and more particularly, to data processors utilizing circular data buffers.

2. Description of the Prior Art

In the field of data processing it is sometimes necessary or convenient to process data which is stored in a first-in-first-out arrangement. Particularly in the art of signal processing, data is input in a time sequential fashion and retained in time order as processing proceeds. Older data is discarded from the head of the list of data while new data is added to the foot of the list.

One way of implementing such a data arrangement is to use a real or a simulated shift register. As each new data sample is input, the oldest sample is discarded; each remaining sample is moved up one storage location; and the newest sample is put in the first location. Such an arrangement is shown in an article by L. R. Rabiner, "A Simplified Computational Algorithm for Implementing FIR Digital Filters," IEEE TRANSACTIONS ON ACOUSTICS, SPEECH, AND SIGNAL PROCESSING, June, 1977 at page 260. As Rabiner notes, such an implementation is costly in processing time. For N signal samples, there must be N shifts of the data each time a new sample is input.

A second and better technique shown by Rabiner is to use a dynamic storage array. This leaves the data samples static, but moves a pointer through the locations, designating the newest sample. The location of any desired sample can be located by its relation forward or backward from the newest sample. However, as Rabiner indicates, all calculations which displace the pointer forward or backward must include a check to insure that the new pointer location does not fall outside the range of the data array. Executing the necessary range check requires significant computing time which can be better spent performing actual signal computations.

SUMMARY OF THE INVENTION

The present invention comprises apparatus for implementing a dynamic storage array, otherwise known as a circular data buffer, in random access memory of a data processor, while greatly reducing the processor time required for performing range checks to assure that the array pointer remains within the buffer area. The invention can be used for defining any number of data buffers of arbitrary length and located anywhere within the random access memory.

A limit register is used to define the topmost location of a given data buffer and a modulus register is used to define its length. Limit register and modulus register contents are set under program control, each new set of values defining a new data buffer. A comparator determines when an applied data address is greater than the topmost buffer location and a subtraction is performed to reduce the applied address by the buffer length.

First apparatus is supplied to perform this subtraction invariably whenever the applied address is out of range, and second apparatus is supplied to perform this subtraction conditionally under program control whenever suitable to the program being executed. The first apparatus serves to reduce the number of machine cycles in the innermost and most frequently operated control program loop, while the second apparatus serves to reduce the number of machine cycles in other parts of the control program where direct program control is convenient.

BRIEF DESCRIPTION OF THE DRAWING

The drawing shows one embodiment of the present invention.

DETAILED DESCRIPTION

Data processor 10 operates under control of a stored control program contained in control memory 20. Data is contained in data memory 90 and is accessed by processor 10 over signal path 101 which carries read/write control signals as well as binary data words to be read from or written into memory 90. Processor 10 generates binary addresses for accessing memory 90 which addresses are stored temporarily in address register 30.

A number M of contiguous memory locations in memory 90 are set aside for use as a circular data buffer. As an illustration, five contiguous memory locations are shown in the FIGURE with memory addresses ranging from 1000 through 1004. The number M, in this case five, is stored in binary form in modulus register 50 by processor 10 under program control. The memory address L of the highest memory location used as the circular data buffer, in this case the address 1004, is stored in binary form in limit register 40 by processor 10 under program control. Together, the contents of the limit register 40 and modulus register 50 serve to define the circular data buffer area by designating its uppermost location L and its length M. Processor 10 can designate any number of such buffers by changing the values stored in registers 40 and 50 as needed.

Comparator 60 compares the binary number contained in address register 30 with the binary number contained in limit register 40. In the event that the number contained in address register 30 is greater than the number contained in limit register 40, a binary one control signal is produced on output lead 102. Thus comparator 60 produces a binary one signal whenever processor 10 attempts to address a location in memory 90 which is above the top of the circular data buffer.

Subtractor 70 conditionally subtracts the binary number contained in modulus register 50 from the binary number contained in address register 30 and outputs the difference to data address register 80. Subtraction takes place only when comparator 60 produces a binary one control signal on lead 102. If a binary zero control signal is present on lead 102, subtractor 70 passes the binary number contained in address register 30 to data address register 80 unchanged.

The apparatus so far described is sufficient to simplify and speed the operation of processor 10 in the innermost loop of its data processing control program. Processor 10 is able to make one pass through the data stored in the circular data buffer without regard to testing for violation of the upper limit of the buffer area. Comparator 60 will detect upper boundary violation and subtractor 70 will reduce the address by M to bring it within range of the circular data buffer. Under control of processor 10, however, the address stored in address register 30 may take on a value larger than the value of the content of limit register 40 plus modulus register 50, i.e., M plus L. In such a case subtractor 70 will reduce the address value by M but this will be insufficient to bring the address into the range of the circular data buffer. It is important, therefore that the value in address register 30 never become larger than M plus L, where L is the upper address limit of the circular data buffer.

The task of keeping the value in address register 30 no more than M plus L falls to the control program at the next level of control which encloses the innermost control loop. This next level of the control program is simplified and speeded in its operation by the action of AND-gate 100.

Lead 102 from comparator 60 carries to AND-gate 100 information as to whether or not the address generated by processor 10 and stored in address register 30 is greater than L, the contents of limit register 40. Processor 10 produces a signal on lead 103 which acts as an interrogation signal when the control program must take action based upon this information. In one possible embodiment, a signal on lead 103 can be produced in response to a particular operation code appearing in the control program. In this way a single instruction may be set aside from the repertoire of processor 10 and may be used to determine if the register 30 address is too large. Based on this information, processor 10 may then subtract M from the contents of an internal index register and gate this new value to address register 30.

In an alternate and preferred embodiment, one bit is set aside in the operation code of all instructions for processor 10. Whenever an instruction is performed wherein this bit is set to a binary one, a binary one signal is produced on lead 103. Lead 102 is connected to an inverting input of AND-gate 100 so that AND-gate 100 will produce an output when there is simultaneously a binary zero signal on lead 102, indicating that the register 30 address is not greater than L. Upon the coincidence of these two events, an output is conveyed from AND-gate 100 to processor 10 which acts to inhibit the execution of the instruction in which the bit is set. Most conveniently, this bit is set to a binary one in an instruction which subtracts M from the contents of an internal index register and gates this new value to address register 30. Such a conditional subtract instruction is conveniently included in the portion of the control program which sets up register contents prior to operation of the innermost control loop. The control program can then execute the conditional subtract instruction invariably, but the instruction will only decrement the value in address register 30 when it is needed. If decrementing is not needed, as determined by comparator 60, the instruction will result in no operation.

In the embodiment described, the limit register has illustratively been used to contain the highest address of the circular data buffer area. This is a convenience to control programs which step through the buffer locations in the direction of increasing addresses. In certain applications, it may be desired to step through the buffer locations in the direction of decreasing addresses. In such a case it may become more convenient to store in the limit register the lowest address of the circular data buffer area. Such use is well within the contemplation of the present invention. The topmost buffer location now becomes the location with the address of lowest numerical value. This and other equivalent ways of practicing the invention will become obvious to those with ordinary skill in the art.

What is claimed is:

1. For use with a data processor, apparatus for defining a circular data buffer in a random access data memory comprising:
   first means for storing the addresses of the topmost location of said buffer,
   second means for storing the number of locations comprising said buffer,
   means for applying a first address,
   means responsive to said means for applying and to said first means for storing for determining if said first address is greater than said address of the topmost location, and
   means comprising said data processor responsive to said means for determining and to said second means for storing for arithmetically altering said first address.

2. Apparatus as set forth in claim 1 further comprising means responsive to said data processor for accessing a random access data memory with said first address so arithmetically altered.

3. For use with a data processor, apparatus for defining a circular data buffer in a random access data memory comprising:
   first means for storing the addresses of the topmost location of said buffer,
   second means for storing the number of locations comprising said buffer,
   means for applying a first address,
   means responsive to said means for applying and to said first means for storing for determining if said first address is greater than said address of the topmost location, and
   means responsive to said means for determining and to said second means for storing for arithmetically altering said first address, said means for arithmetically altering comprising
   said data processor, and
   means responsive to said second means for storing for subtracting said number of locations from said first address.

4. Apparatus as set forth in claim 3 further comprising means responsive to said means for arithmetically altering for accessing a random access data memory with said first address so arithmetically altered.

5. Apparatus for use with a data processor comprising:
   a limit register loadable with information under control of said data processor,
   a modulus register loadable with information under control of said data processor,
   a comparator for comparing an address with the contents of said limit register,
   an arithmetic circuit responsive to said comparator for arithmetically altering said address by the contents of said modulus register, and
   means responsive to said comparator for controlling the execution of instructions by said data processor.

6. Apparatus as set forth in claim 5 further comprising means responsive to said comparator and to said data processor for controlling the execution of instructions by said data processor.

* * * * *